(12) United States Patent
Lau et al.

(10) Patent No.: US 6,799,125 B2
(45) Date of Patent: Sep. 28, 2004

(54) METHOD AND SYSTEM FOR ON-LINE MONITORING OF BEARING INSULATION IN AN ELECTRICAL GENERATOR

(75) Inventors: James Frederick Lau, Orlando, FL (US); Abraham Nieves, Orlando, FL (US)

(73) Assignee: Siemens Westinghouse Power Corporation, Orlando, FL (US)

( * ) Notice: Subject to any disclaimer, the term of this patent is extended or adjusted under 35 U.S.C. 154(b) by 90 days.

(21) Appl. No.: 10/247,111

(22) Filed: Sep. 19, 2002

(65) Prior Publication Data

US 2004/0059523 A1 Mar. 25, 2004

(51) Int. Cl.⁷ .............................................. G01B 5/28
(52) U.S. Cl. ............................................... 702/38
(58) Field of Search ................. 702/38, 183; 310/180, 310/75, 45, 52, 89; 604/35; 180/68, 68.2; 439/685; 324/551; 415/80; 62/113; 200/5; 29/596; 15/391; 418/55

(56) References Cited

U.S. PATENT DOCUMENTS

| | | | |
|---|---|---|---|
| 5,006,769 A | | 4/1991 | Posedel |
| 5,032,826 A | | 7/1991 | Miller et al. |
| 5,494,401 A | * | 2/1996 | Varadan ....................... 415/80 |
| 6,300,701 B1 | | 10/2001 | Ong et al. |
| 6,460,013 B1 | * | 10/2002 | Nippes ....................... 702/183 |

* cited by examiner

Primary Examiner—John Barlow
Assistant Examiner—Tung S Lau

(57) ABSTRACT

The present invention monitors an electrical generator (10) to provide an indication of a problem in the generator's bearing insulation (26), such as insulation damage or insulation bridging, and sets an alarm to warn an operator of the problem, thereby avoiding damage to the electrical generator (10). Methods and systems consistent with the present invention identify problems with bearing insulation (26) by monitoring the naturally occurring shaft voltage on the generator rotor (12) and by setting an alarm if the shaft voltage drops below a predetermined value.

6 Claims, 3 Drawing Sheets

METHOD AND SYSTEM FOR ON-LINE MONITORING OF BEARING INSULATION IN AN ELECTRICAL GENERATOR

FIELD OF THE INVENTION

The present invention relates to electrical generators, and more particularly to methods and systems for monitoring the condition of bearing insulation in an electrical generator.

BACKGROUND

Rotors in large synchronous electrical generators are supported at each end by generator bearings. Generator bearings provide a smooth-lubricated surface for rotors to spin on. Generator bearings typically must be insulated in order to electrically isolate the rotor from ground and from the rest of the generator. This electrical isolation prevents naturally occurring voltages on the rotor from shorting through the bearings. Such shorts could damage the surface of the bearings and lead to bearing wipe, which would significantly damage the generator.

Shorts in bearing insulation may be caused by a number of different situations. Shorts may be caused, for example, by damage to the bearing insulation itself, by improperly insulated bearing instrumentation (such as bearing thermocouples), or by a bridge across the bearing insulation created by oil residue, dirt, paint, or a repair tool left in the generator. One conventional approach for identifying bearing insulation problems in a generator that is operating is to test of the value of the resistance of the insulation with a device called a Meggar™. However, this test is only possible on certain bearing configurations. It will not work, for example, with a bearing configuration known as a single-insulation bearing.

Various attempts have been made to detect problems in a generator while the generator is operating. U.S. Pat. No. 5,032,826 to Twerdochlib, for example, which is incorporated by reference herein in its entirety, discloses a monitor for detecting generator core hot spots by monitoring rotor shaft voltage. However, a need remains for a reliable technique for monitoring bearing insulation while a generator is in operation in a way that is not restricted to specific bearing configurations.

SUMMARY OF THE INVENTION

With the foregoing in mind, methods and systems consistent with the present invention provide a means of predicting problems with bearing insulation in an electrical generator, such as insulation damage or bridging, to provide an indication of the problem to an operator and thereby prevent possible damage to an electrical generator. This and other objects, features, and advantages in accordance with the present invention are provided by a method that comprises the steps of monitoring the shaft voltage occurring over the length of the rotor of the electrical generator; and setting, when the shaft voltage drops below a predetermined value, an alarm to indicate to an operator that a problem exists.

A monitoring system consistent with the present invention is provided for identifying a problem with bearing insulation in an electrical generator. The monitoring system comprises means for monitoring shaft voltage occurring over the length of the electrical generator on a rotor of the electrical generator; and means for setting, when the shaft voltage drops below a predetermined value, an alarm to indicate to an operator that a problem exists.

A monitoring system consistent with the present invention is also provided for identifying a problem with bearing insulation in an electrical generator that comprises at least one shaft-riding brush mounted to the rotor of the electrical generator for providing an indication of a shaft voltage across the electrical generator; an analog-to-digital converter for converting the shaft voltage to a digital signal; and a data-processing system for monitoring the shaft voltage and for setting an alarm when the shaft voltage drops below about 5 volts.

DETAILED DESCRIPTION

Figure 1:
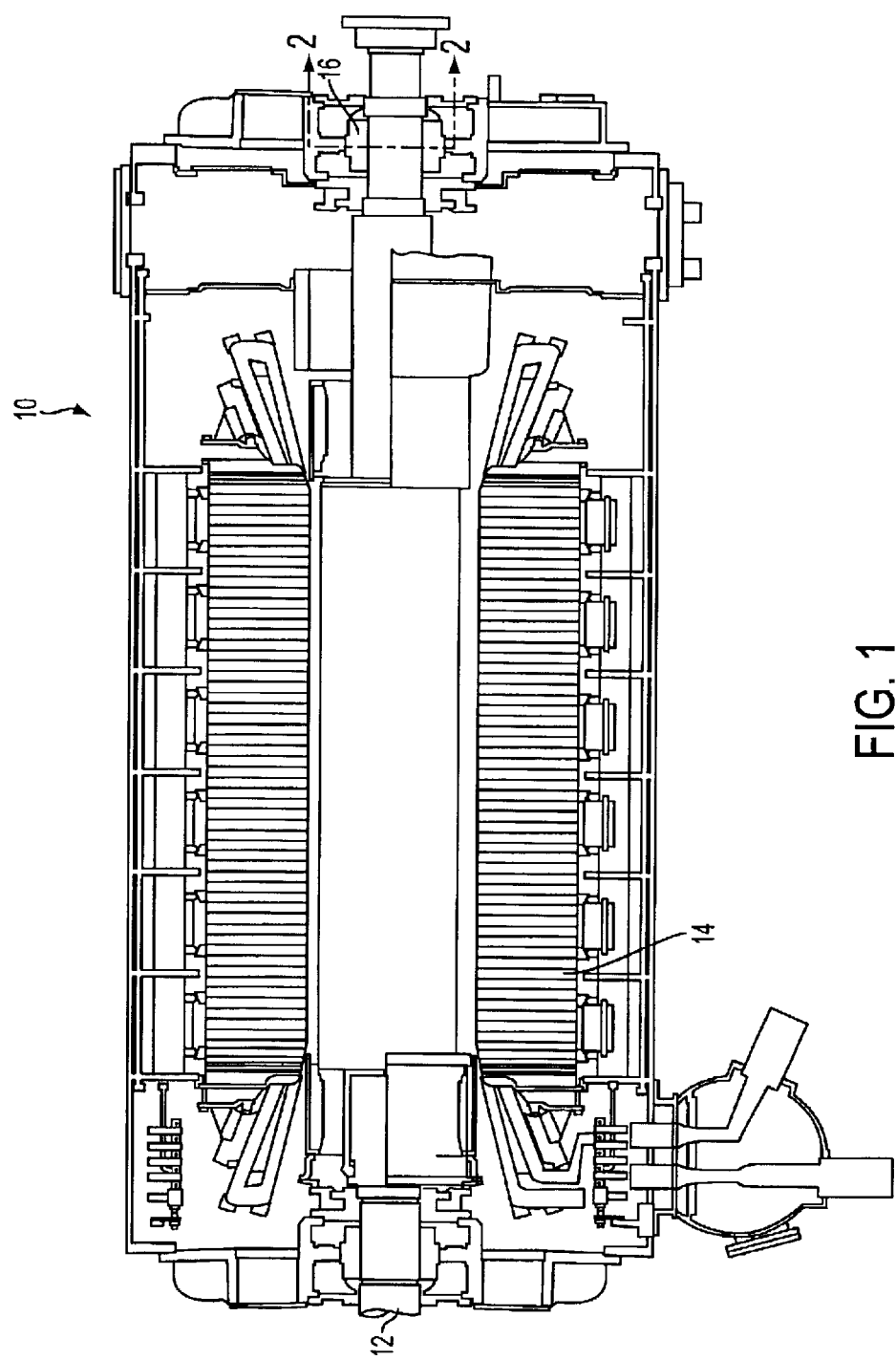
FIG. 1 illustrates a conventional synchronous electrical generator consistent with the present invention.

FIG. 1 illustrates a conventional synchronous electrical generator 10. The generator 10 includes a rotor 12 and a stator 14. The rotor 12 is typically machined from a one-piece solid steel forging and then wound with conductors called field windings. The field windings are made up of straight sections of conductor that run the length of the rotor and of end sections that connect the straight sections into one long conductor. The stator 14 is typically formed by stacking a large number of steel laminations and then winding the laminations with conductors called stator windings. The rotor 12 is installed in the stator 14 and is supported at each end by rotor bearings 16.

A source of rotary-mechanical energy, such as a steam turbine or a combustion turbine, turns the rotor 12 and causes the field windings to rotate within the stator 14. When the field windings are supplied with an excitation current, the field windings produce a magnetic flux that induces an electric current in the stator windings. The large amount of magnetic flux present in the electrical generator tends to produce residual-electrical currents in the solid-steel forging of the rotor. To prevent this current from shorting through the bearings 16, the bearings 16 are provided with insulation to electrically isolate the rotor 12 from ground and from the rest of the generator 10. As a result, a potential difference tends to develop over the length of the rotor in the range of about 30 to 100 volts.

Figure 2:
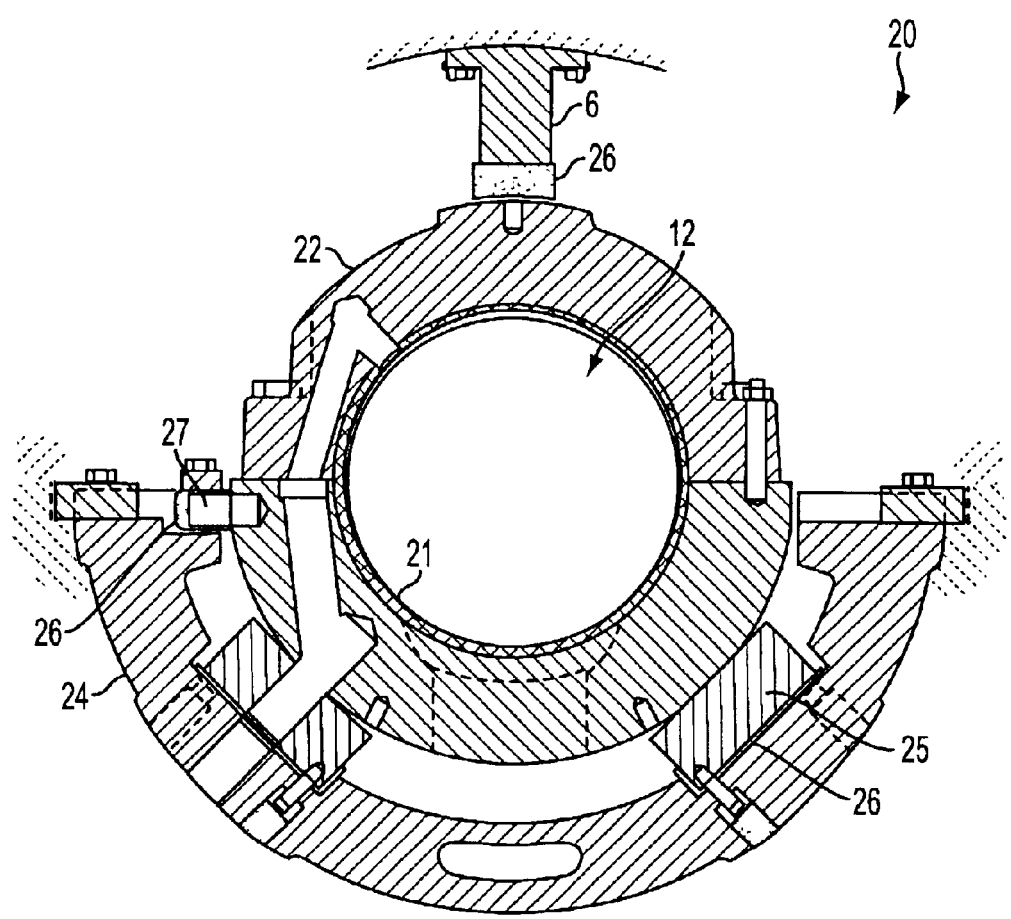
FIG. 2 illustrates a conventional rotor bearing consistent with the present invention.

FIG. 2 illustrates an example of a rotor bearing 20 consistent with the present invention. The rotor bearing 20 illustrated is a single-insulated, sleeve-type bearing configuration. It will be readily apparent to one of skill in the art that many other rotor bearing configurations are suitable for use with the present invention. The rotor bearing configuration 20 includes a bearing babbitt 21, enclosed by a bearing sleeve 22. The bearing sleeve 22 is supported from below by a bearing seat 24 and two bearing support seats 25. The bearing support seats 25 are insulated from the bearing support 24 by bearing insulation 26. The bearing sleeve 22 is kept in place by a bearing keeper 27 at the top of the bearing sleeve 22. The bearing sleeve 22 is insulated from the bearing keeper 27 by bearing insulation 26. The bearing sleeve 22 is also prevented from rotating by a stop dowel (also referred to as a anti-rotation pin) located in the bearing seat 24. The bearing sleeve 22 is insulated from the bearing seat 24 by insulation 26.

If the bearing insulation 26 in the rotor bearing 20 is damaged or is electrically bridged, an electrical path may be formed through the components of the rotor bearing to ground. In such a case, the voltage may short across the thin oil film that exists between the rotor 12 and the babbitt 21, which can damage the surface of the babbitt 21 and lead to bearing wipe.

Figure 3:
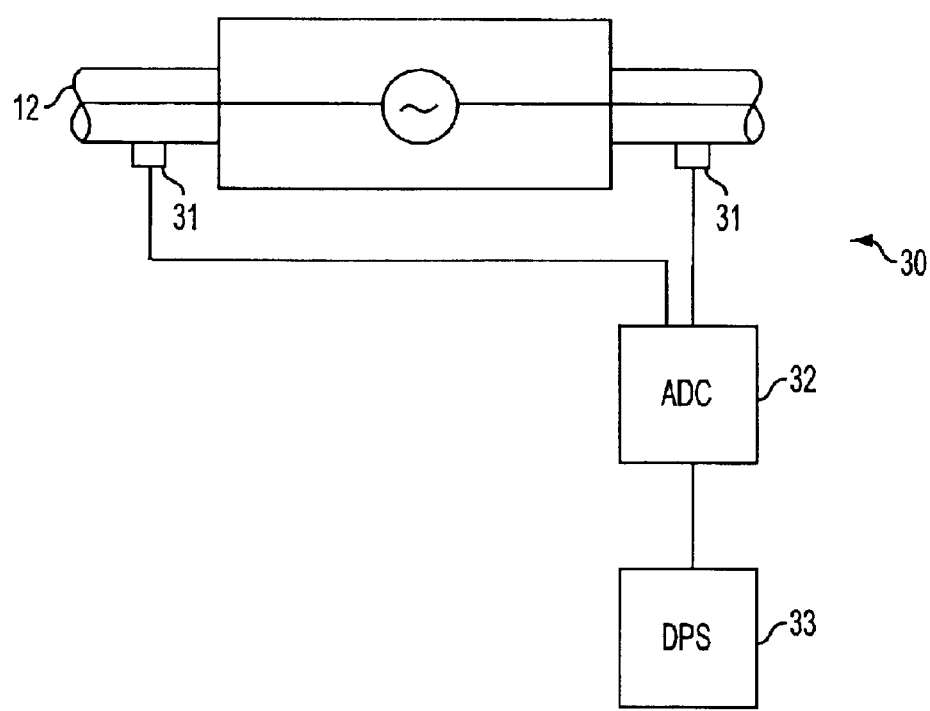
FIG. 3 illustrates a monitoring system consistent with the present invention.

FIG. 3 illustrates a monitoring system 30 consistent with the present invention. The monitoring system 30 includes a shaft-riding brush 31 at each end of the generator. In many installations, there may already be a shaft-riding brush at the turbine end of the generator. If so, this brush may used in lieu of a second shaft-riding brush. Each shaft-riding brush 31 provides an electrical connection to the spinning rotor to permit the voltage at each end of the rotor 12 to be measured. The shaft-riding brushes 31 are also electrically connected to an analog-to-digital converter (ADC) 32 for converting the analog voltages signals from the rotor 12 to digital signals for subsequent processing and storage by either an integral or a separate data-processing system (DPS) 33. The data-processing system 33 receives the digital signals from the ADC 32 and processes these digital signals. When the voltage across the rotor goes low (for example less than about 5 volts), this is an indication that the bearing insulation is not functioning properly. To avoid damage to the generator, the data-processing system 33 is configured to provide a visual and audible indication of the low-voltage condition to an operator. The data-processing system may also be configured to automatically trip the generator.

The present invention has been described with reference to the accompanying drawings that illustrate preferred embodiments of the invention. The invention may, however, be embodied in many different forms and should not be construed as limited to the embodiments set forth herein. Rather, these embodiments are provided so that this disclosure will be thorough and complete, and will fully convey the scope of the invention to those skilled in the art. Thus, the scope of the invention should be determined based upon the appended claims and their legal equivalents, rather than the specific embodiments described above.

What is claimed is:

1. A method of identifying a problem with bearing insulation in an electrical generator, comprising the steps of:

monitoring shaft voltage over the length of a rotor of the electrical generator; and setting an alarm, when the shaft voltage drops below a predetermined value, to provide an indication of the bearing insulation problem to an operator;

wherein the step of monitoring shaft voltage includes mounting at least one shaft-riding brush to the rotor to provide an indication of the shaft voltage to a data-processing system; and wherein the step of setting an alarm includes tripping the electrical generator.

2. The method of claim 1 wherein the predetermined value is about 5 bolts.

3. A monitoring system for identifying a problem with bearing insulation in an electrical generator, comprising:

means for monitoring shaft voltage over the length of a rotor of the electrical generator;

means for setting an alarm, when the shaft voltage drops below about a predetermined value, to provide an indication of the bearing insulation problem to an operator;

a data-processing system and at least one shaft-riding brush mounted to the rotor of the electrical generator for providing an indication of the shaft voltage to the data-processing system; and a relay for tripping the electrical generator when the shaft voltage drops below the predetermined value.

4. The monitoring system of claim 3 wherein the predetermined value is about 5 volts.

5. A monitoring system for identifying a problem with bearing insulation in an electrical generator, comprising:

at least one shaft riding brush mounted to a rotor of the electrical generator for providing an indication of a shaft voltage across the electrical generator;

a data-processing system for monitoring the shaft voltage and for setting an alarm when the shaft voltage drops below a predetermined value to provide an indication of the bearing insulation problem to an operator; and a relay for tripping the electrical generator when the shaft voltage drops below the predetermined value.

6. The monitoring system of claim 5 wherein the predetermined value is about 5 volts.

* * * * *